United States Patent [19]

Buurma

[11] 4,323,887
[45] Apr. 6, 1982

[54] CMOS ANALOG TO DIGITAL CONVERTER WITH SELECTABLE VOLTAGE FOLLOWER BUFFERING

[75] Inventor: Gerald B. Buurma, San Jose, Calif.

[73] Assignee: National Semiconductor Corporation, Santa Clara, Calif.

[21] Appl. No.: 199,890

[22] Filed: Oct. 23, 1980

[51] Int. Cl.³ .............................................. H03K 13/02
[52] U.S. Cl. ............................. 340/347 AD; 307/355
[58] Field of Search ................ 340/347 AD, 347 DA; 307/350–363; 324/99

[56] References Cited

U.S. PATENT DOCUMENTS

| 3,525,948 | 3/1966 | Saerer | 340/347 AD |
| 4,068,138 | 1/1978 | Miyakawa | 307/362 |
| 4,191,900 | 3/1980 | Redfern | 307/355 |
| 4,197,472 | 4/1980 | Aoki | 307/355 |
| 4,211,942 | 7/1980 | Aoki | 307/355 |

OTHER PUBLICATIONS

Spinairne "Rev. Sci. Instrum.", vol. 47, No. 4, Apr. 1976, pp. 437–439.

*Primary Examiner*—Charles D. Miller
*Attorney, Agent, or Firm*—Gail W. Woodward; James A. Sheridan; Neil B. Schulte

[57] ABSTRACT

An analog to digital converter is fabricated using CMOS construction and uses a successive approximation register to develop the bits in a digital word. A digital to analog converter converts the digital word to analog voltages which are compared with the analog input. The comparator is coupled to the register so as to determine its word bit sequence. The digital words most significant bit is set first in accordance with whether the analog input is greater or less than half of the reference voltage. Then the next most significant bit is evaluated and this process is continued until the least significant bit is evaluated at which time the conversion is complete. In the CMOS circuit, a switched comparator is employed and it draws a capacitor charging current in its operation. Accordingly, it is useful to buffer the comparator input. Two buffers are employed, one p-type and one n-type. They have common inputs and outputs that are selected as a function of the most significant bit in the digital word. The selected output is coupled to the comparator so that the comparator does not load the analog signal input.

7 Claims, 6 Drawing Figures

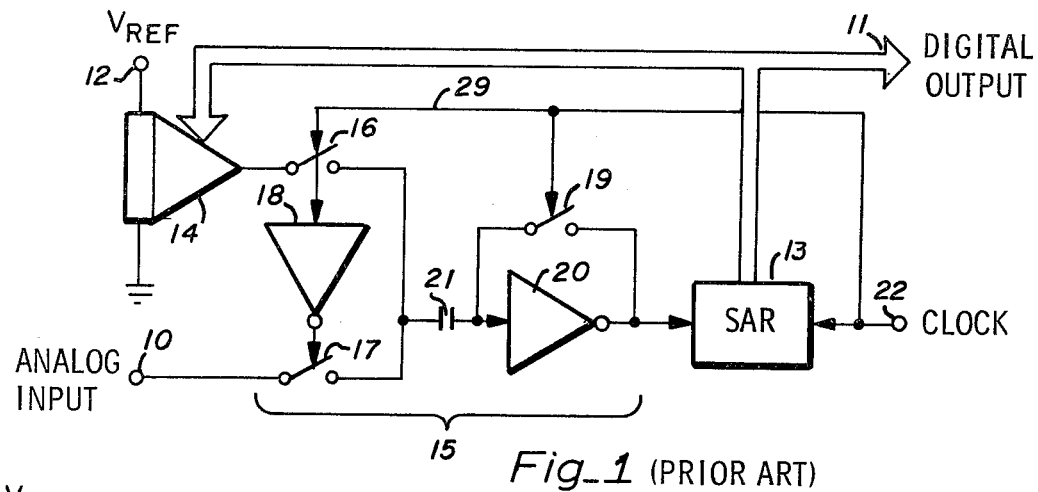
Fig_1 (PRIOR ART)
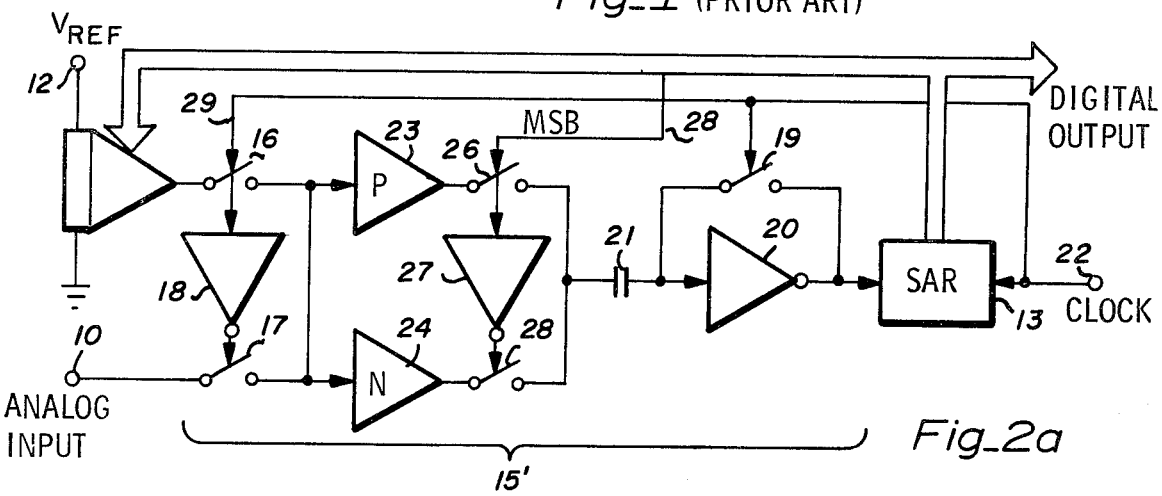
Fig_2a
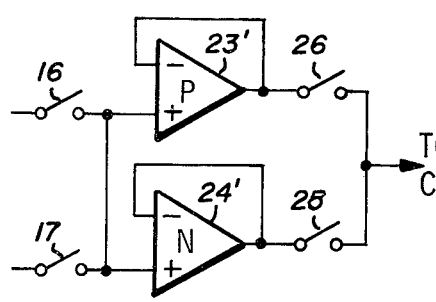
Fig_2b
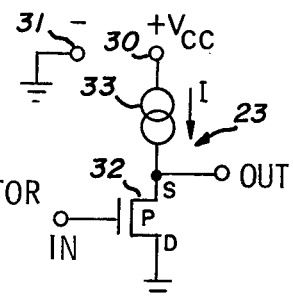
Fig_3
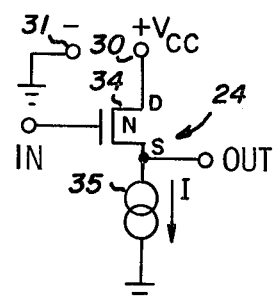
Fig_4
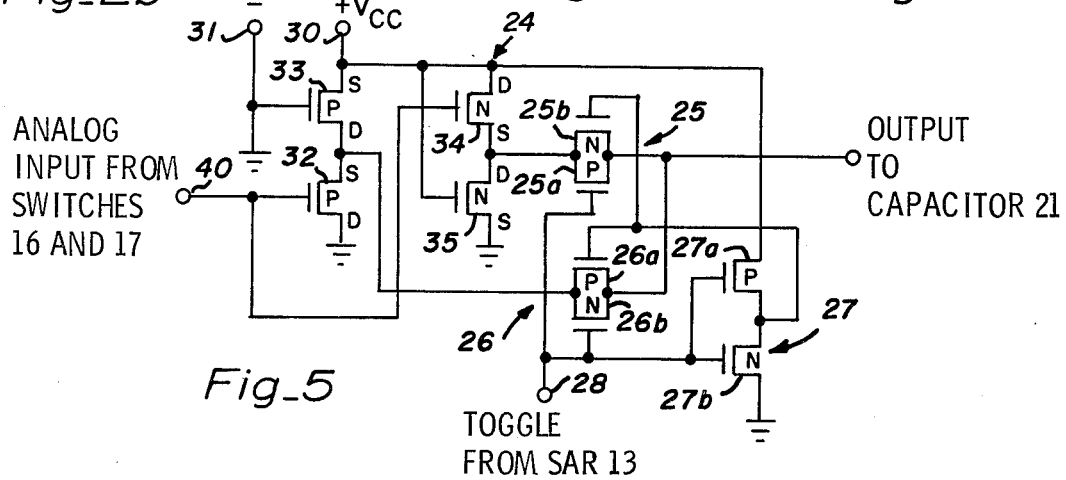
Fig_5

CMOS ANALOG TO DIGITAL CONVERTER WITH SELECTABLE VOLTAGE FOLLOWER BUFFERING

BACKGROUND OF THE INVENTION

The invention relates to analog-to-digital (A/D) converters of the kind taught as prior art in U.S. Pat. No. 4,198,622, which is assigned to the assignee of the present invention. Basically, such A/D converters employ a successive approximation register (SAR) to generate a digital word in a particular sequence of bit combinations that relate to the analog voltage. A digital-to-analog (D/A) converter is used to convert the digital word to a voltage which is also related to a reference voltage ($V_{REF}$) applied to the D/A converter. The D/A converter is coupled to a comparator which is also fed the analog voltage to be evaluated. The comparator output is coupled to the SAR to establish its word bit sequence. U.S. Pat. No. 4,191,900, which is also assigned to the assignee of the present invention, details a precision plural input comparator suitable for A/D converter applications.

In operation, the SAR establishes the digital word one bit at a time. The most significant bit (MSB) is determined first, by comparing the analog input with $V_{REF}$. If the input is greater than $V_{REF}/2$, the MSB is a one. If smaller, the MSB is a zero. Then the next MSB is established by comparing the analog input inside the previously determined $V_{REF}/2$ value. In other words, the next MSB is determined in terms of $V_{REF}/4$. Next, the bit associated with $V_{REF}/8$ is determined and so on until all bits are evaluated. This selection process is well known in the prior art.

In CMOS circuits, the comparator taught as prior art in U.S. Pat. No. 4,191,900 is employed because of its speed and sensitivity. While such a comparator operates in a switching mode and is a-c coupled, it responds to d-c inputs. However, since the coupling capacitors must be charged in the switching cycle, there is some input loading which presents itself as an input current, the value of which is related to the change in input d-c value during the switching interval.

My copending application Ser. No. 146,477, filed Sept. 28, 1978, shows a circuit for reducing the loading on the analog input circuit. Here a CMOS voltage follower is connected into the comparator input during the switching cycle. Thus, the input current is supplied by the voltage follower during the initial portion of the cycle. Then the follower is shorted out and the comparator connected directly to the analog input. Using this arrangement reduces input loading because the voltage follower will charge the capacitance to within one transistor threshold of its final value. Input loading will then be reduced to only a minor, less than one threshold, charging requirement.

SUMMARY OF INVENTION

It is an object of the invention to fully buffer the input of a switching comparator in a CMOS A/D converter.

It is a further object of the invention to employ a pair of CMOS voltage followers in the input circuit of a switching comparator, with each one operating over a portion of the input range, and one of the pair being selected as a function of which half of the input voltage is represented.

It is a still further object of the invention to employ a pair of voltage follower buffers in a CMOS switching comparator in an A/D converter using a SAR with the MSB in the SAR being used to select which one of the pair of buffers is employed.

These and other objects are achieved as follows: A CMOS A/D converter employs the conventional SAR and a switched comparator to operate the SAR. A pair of voltage followers is employed to buffer the comparator input to reduce its loading of the analog input. The buffers, in the preferred embodiment, are of the source follower variety using current source loads, but differential amplifiers with negative feedback would work as well. Neither of these buffers will operate over the full input range. One of these buffers is switched into operation with the one being selected determined by the MSB in the SAR digital word.

BRIEF DESCRIPTION OF THE DRAWING

FIG. 1 is a block diagram of a prior art A/D converter.

FIG. 2a is a block diagram of an A/D converter using the circuit of the invention.

FIG. 2b is an alternative voltage follower arrangement for the FIG. 2a circuit.

FIG. 3 is a schematic diagram of a p-channel voltage follower for operating on the upper voltage ranges.

FIG. 4 is a schematic diagram of an n-channel voltage follower for operating on the lower voltage ranges.

FIG. 5 is a schematic diagram of a circuit useful in practicing the invention.

DESCRIPTION OF THE INVENTION

The invention employs complementary metal oxide semiconductor (CMOS) technology to create circuits. This technology is well known in the conventional prior art and will not be further detailed herein.

FIG. 1 is a block diagram of a prior art circuit. The device is basically an analog-to-digital (A/D) converter, wherein an analog voltage applied to input terminal 10 produces a digital output at 11. The actual analog input is referenced to a d-c potential applied to $V_{REF}$ terminal 12.

The heart of the circuit is a successive approximation register (SAR) 13 which operates as described in U.S. Pat. No. 4,198,622 as a control logic unit (CLU). The SAR 13 is operated from a clock signal at terminal 22 and is programmed to step its digital output 11 through a bit sequence that will successively operate D/A converter 14. Comparator 15, which is also operated from clock 22, on line 29, tells SAR 13 the relationship between the analog input at terminal 10 and the D/A converter 14 output. Typically the first step relates to determining the most significant bit (MSB). If the analog input is greater than $V_{REF}/2$ the MSB is a one. If less then $V_{REF}/2$, the MSB is a zero. Comparator 15 makes this determination and produces a low output when the MSB is a one and high when the MSB is a zero. The SAR 13 looks at the next bit to the MSB and does a similar comparison. This process is repeated until all bits are evaluated.

A commercially available SAR is in the form of an MM54C905, which is a 12-bit device housed and a 24-pin package. The digital signals are available on pins 4–9 and 16–21. The MSB is pin 21. Clock signals are applied to pin 13.

Comparator 15 has two inputs, one coupled to D/A converter 14 and one coupled to analog input 10. The comparator inputs are switched in complementary fashion, using switches 16 and 17 operated from clock input 22, and inverter 18. Switch 19 periodically shorts inverter 20 thereby driving it to its trip point. Coupling capacitor 21 is therefore periodically charged to the difference between the output of D/A converter 14 and the trip point of inverter 20 while switches 16 and 19 are closed. Thus when switch 17 is closed (and switches 16 and 19 opened) capacitor 21 will charge or discharge depending upon the comparison between the analog input at 10 and the output of D/A converter 14. While such a comparator is a-c operated, it responds to d-c signals and can be made quite sensitive. For example inverter 20 may actually be made up of a plurality of cascaded a-c coupled amplifiers each with its own coupling capacitor and shorting switch. While MOS/FET devices are employed the inverting input, which couples to the analog input 10, may pass current. This is due to capacitor 21 charging or discharging during the clock cycle. Accordingly, it is desirable to buffer the comparator input.

Unfortunately, the conventional prior art CMOS buffer (or voltage follower) has an offset, between input and output. With a simple source follower, this offset is typically equal to one transistor gate threshold voltage. Thus if a buffer is merely inserted into the analog input line the charging current will not load the input but an error is introduced. This problem can be minimized as taught in my copending application, Ser. No. 946,477, filed Sept. 28, 1978. Here the buffer is used only to charge the comparator capacitance to within one transistor threshold. Then the buffer is shorted out and the final charge achieved without buffering.

The invention specifically relates to the dual buffers 23 and 24 of FIG. 2a. One of these two buffers is selected by switches 25 and 26, which act in complementary fashion due to inverter 27, as a single-pole, two-position switch. Line 28 couples to the MSB pin of SAR 13. As shown above, when the analog input is $V_{REF}/2$, the MSB is a one which turns switch 26 on on as to invoke buffer 23. Inverter 27 produces a zero which turns switch 25 off. When the analog voltage is less than $V_{REF}/2$, the MSB is zero which turns switch 26 off. For this condition, inverter 27 creates a one for switch 25 to turn it on so as to invoke buffer 24. Thus, one of the two buffers is selected in accordance with the MSB.

Buffers 23 and 24 have a common input terminal that is alternately switched between analog input terminal 10 and the output terminal of D/A converter 14. This switching is achieved by switches 16 and 17 operated from clock pulses on line 29. When switches 16 and 19 are closed capacitor 21 will charge to a voltage that represents the difference between the trip point of inverter 20 and the output of D/A converter 14 through the selected buffer. Then when switch 17 is closed, and switches 16 and 19 opened, the input is switched to analog input 10 through the same selected buffer. If the analog input voltage exceeds the D/A converter 14 output, the output of inverter 20 will go low thus informing SAR 13 of the polarity relationship. It can be seen that this input switching will cancel out any offset present in the associated input buffer assuming the offset is constant during the switching operation. Whichever one of buffers 23 and 24 is selected its input to output offset voltage will be canceled and will have no effect upon the comparison of input potentials. This offset will appear as a d-c voltage across capacitor 21 which is canceled during the a-c switching operation of the comparator thereby compensating for variations in device parameters due to manufacturing or present as a result of variations in ambient conditions.

Buffers 23 and 24 are typically simple source followers which have an input to output offset of one transistor threshold voltage. As explained above, this is not a problem because the circuit is self compensating. However, if desired, a low offset buffer can be employed as shown in FIG. 2b. Here buffers 23' and 24' are differential amplifiers with the output connected to the inverting input. Thus these buffers operate as simple voltage followers with a relatively low offset voltage. Using typical CMOS devices the circuit of FIG. 2b will have an offset at least an order of magnitude lower than the simple source follower devices mentioned above.

FIG. 3 is a schematic diagram of buffer 23. Operating potential is provided between $V_{CC}$ terminal 30 and ground 31. A p-channel transistor 32 is connected as a source follower operating from a current source load 33. In such a circuit, the output which is the source voltage of transistor 32 will follow one threshold above the gate potential. Since the back gate of transistor for 32 is normally connected to $V_{CC}$ at terminal 30, it can be seen that as the source of transistor 32 approaches ground, the back gate bias will turn it off. Thus such a source follower will not track the lower input voltages but will be effective for signals above $V_{CC}/2$.

FIG. 4 is a schematic diagram of buffer 24. An N-channel transistor 34 is connected as a source follower using current source 35 as a load. In this circuit the output, which is the source voltage of transistor 34, follows the input at one threshold below its gate voltage. In this case, the back gate of transistor 34 is connected to ground so that as its source is driven toward $V_{CC}$ the back gate bias will tend to turn it off. This means that buffer 24 will not track the higher input voltages but will function well below $V_{CC}/2$.

By combining the buffers of FIGS. 3 and 4 as shown in FIG. 2, the buffer outputs to capacitor 21 can handle the analog input between ground and the $V_{CC}$ supply voltage. This is true, even though the separate buffers will not operate over the required range. In effect, SAR 13 will select the input buffer by way of switches 25 and 26, so as to avoid the inoperative buffer ranges.

FIG. 5 is a schematic diagram of the preferred implementation of the FIG. 2a circuit and uses the buffers of FIG. 3 and 4. Toggle terminal 28 is connected to MSB of SAR 13. This would be pin 21 of an MM54C905. Input terminal 40 is actually the outputs of switches 16 and 17. In terms of the buffers 23 and 24, p-channel transistor 33' is connected with its gate grounded to act as a load for transistor 12. N-channel transistor 35', with its gate connected to terminal 30, will act as a load for transistor 34. Switches 25 and 26 are implemented as transmission gates that are operated in complementary fashion by inverter 27.

EXAMPLE

The circuit of FIG. 5 was constructed using conventional CMOS devices. The following chart shows the W/L ratios for the various transistors.

| Device | W/L Ratio (Microns) |
|--------|---------------------|
| 25a    | 50/9                |
| 25b    | 25/8                |
| 26a    | 50/9                |
| 26b    | 25/8                |
| 27a    | 12/8                |
| 27b    | 25/9                |

-continued

| Device | W/L Ratio (Microns) |
|---|---|
| 32 | 125/9 |
| 33' | 10/14 |
| 34 | 75/8 |
| 35' | 10/32 |

It will be noted that current source load transistors 33' and 35' have long narrow channels as compared with their active transistors 32 and 34 respectively, which have short wide channels to provide high Gm. This relationship assures a suitable voltage follower characteristic.

This circuit reduced the input loading for large analog signals by a factor of about 100.

The invention has been described and an example detailed. Clearly a person skilled in the art will perceive alternatives and equivalents that are within the spirit and intent of the invention. Accordingly, it is intended that the scope of the invention be limited only by the following claims.

I claim:

1. An input buffer circuit for a CMOS analog to digital converter, having an analog input terminal, a successive approximation register for developing a digital output, and a source of reference voltage, said circuit comprising:

first and second unity gain voltage follower devices having common inputs; means for coupling said common inputs to said analog input terminal; and means for selecting, as a function of the most significant bit of said digital output determined by said successive approximation register, the output of one of said first and second voltage follower devices for coupling to said converter, said selecting being responsive to whether said analog voltage is greater or less than one-half of said reference voltage.

2. The circuit of claim 1 wherein said first and second voltage follower devices comprise differential amplifiers with their outputs coupled to their respective inverting inputs.

3. The circuit of claim 1, wherein said first and second voltage follower devices comprise p- and N-channel source followers, respectively, with current sources coupled in series therewith to act as load elements.

4. The circuit of claim 3, wherein said current sources comprise p-channel and n-channel devices, respectively.

5. The circuit of claim 4, wherein said current sources comprise p-channel and n-channel devices respectively which have their respective gates coupled to negative and positive power supply terminals.

6. The circuit of claim 5, wherein said current sources comprise transistors of much smaller width to length ratios than said first and second source follower devices.

7. The circuit of claim 6, wherein said means for selecting comprise transmission gates.

* * * * *